United States Patent [19]
Lindstedt et al.

[11] Patent Number: 5,581,183
[45] Date of Patent: Dec. 3, 1996

[54] METHOD FOR THE OPERATION OF A MAGNETIC RESONANCE APPARATUS

[75] Inventors: Werner Lindstedt, Kalchreuth; Georg Pirkl, Dormitz, both of Germany

[73] Assignee: Siemens Aktiengesellschaft, Munich, Germany

[21] Appl. No.: 536,771

[22] Filed: Sep. 29, 1995

[30] Foreign Application Priority Data

Sep. 30, 1994 [DE] Germany ............ 44 35 183.6

[51] Int. Cl.$^6$ ............................................ G01V 3/00
[52] U.S. Cl. ...................................... 324/309; 128/653.2
[58] Field of Search .......................... 128/653.2, 653.3; 324/300, 307, 309, 310, 311, 312, 313, 314, 318, 322

[56] References Cited

U.S. PATENT DOCUMENTS

| | | | |
|---|---|---|---|
| 5,087,880 | 2/1992 | Bruder et al. | 324/309 |
| 5,162,730 | 11/1992 | Schmitt et al. | 324/309 |
| 5,278,506 | 1/1994 | Schmitt | 324/309 |
| 5,317,260 | 5/1994 | Kasten et al. | 324/309 |
| 5,337,000 | 8/1994 | Bruder | 324/309 |
| 5,474,067 | 12/1995 | Laub | 128/653.2 |

FOREIGN PATENT DOCUMENTS

| | | |
|---|---|---|
| 0195670 | 9/1986 | European Pat. Off. . |
| 3802082 | 8/1988 | Germany . |
| WO86/04702 | 8/1986 | WIPO . |

OTHER PUBLICATIONS

"Word Programmer for NMR," Danese et al., Rev. Sci. Instrum., vol. 57, No. 7, Jul. 1986, pp. 1349–1353.

"Bildgebende Systeme für die medizinische Diagnostik," Krestel, Ed. (1988), pp. 528–534.

"Microprocessor Interface Techniken," Lesea et al., (1979) pp. 368–369.

*Primary Examiner*—Michael Tokar
*Attorney, Agent, or Firm*—Hill, Steadman & Simpson

[57] ABSTRACT

In a method for operating a magnetic resonance apparatus, having a radio frequency system for transmitting radio frequency excitation pulses and/or for receiving magnetic resonance signals and a gradient system for generating temporally variable, magnetic gradient fields the excitation pulses and gradient fields are activated dependent on time-variant signals. The time-variant signals are made available in the form of discrete signal values. Each discrete signal value of at least one signal is generated by a virtual machine by processing a virtual machine program.

22 Claims, 5 Drawing Sheets

METHOD FOR THE OPERATION OF A MAGNETIC RESONANCE APPARATUS

BACKGROUND OF THE INVENTION

1. Field of the Invention

The present invention is directed to a method for operating of a magnetic resonance apparatus having a radio frequency system for emitting radio frequency excitation pulses and/or for receiving magnetic resonance signals, and having a gradient system for generating chronologically variable magnetic gradient fields, whereby both systems are activated dependent on time-variant signals that are made available in the form of discrete signal values.

2. Description of the Prior Art

A multitude of complex, time-variant signals are required for the operation of a magnetic resonance apparatus for imaging as well as for spectroscopy. First, time-variant and spatially dependent magnetic fields must be superimposed on a uniform field in three spatial directions. These so-called gradient fields are generated by time-variant currents, whereby the required currents have different function curves. Further, time-variant radio frequency pulses are required for the execution of the magnetic resonance. A sinusoidal carrier signal is thereby modulated with an envelope that is determined by one or more functions. Chronologically variable control signals and trigger pulse sequences are required in addition to the function signals for generating the gradient fields and the radio frequency excitation pulses. Included among these are, for example, digital values that determine the frequency and phase relation of the radio frequency excitation pulses, turn-on and turn-off signals, trigger time intervals for function generators that generate the aforementioned, complex function signals, and similar digital values at non-equidistant intervals.

Various methods are known that offer the discrete signal values, including the control and function signals, at the correct time in the magnetic resonance apparatus. A common factor of these known methods is that they all emit the control and function signals in digital form. Digital-to-analog converters with following amplifiers that belong to the systems then generate the physical (actual) signals that are supplied respectively to the gradient coils or radio frequency antenna.

In one such known method, the discrete signal values required for the operation of the magnetic resonance apparatus are sorted in a memory that is known by the designation "control word memory." The signal values are read out for the operation and are supplied to the system. This method requires a large amount of memory space. New sequences can only be implemented by modifying the memory content and the read-out procedure.

Memory space can be saved by using a method disclosed in German published application 38 02 082 and WO 86 04 702 wherein a time duration is attached to the control words or to the signal values. The relatively long times wherein a signal value remains unmodified are thus bridged. The time duration can be stored in the control word memory itself or in a separate time duration memory.

European published application 0 195 670 discloses a method wherein discrete signal values are deposited in a memory before a measurement or before the implementation of a magnetic resonance experiment and are read out by a read-out control for the measurement. The read-out control is operated by information from a control word memory.

In a further known method, the signal values are calculated on-line with a fixed program and variable data. The synchronization again ensues with control signals from the control word memory. Compared to the methods set forth above, this method saves memory space. Given modified or new sequences, the data structure and the program must be matched to the modifications. Mixed forms of these latter two methods are likewise possible.

The format and the structure of a control system with a control word memory is also described in "Bildgebende Systeme für die medizinische Diagnostik", by Erich Krestel, Siemens AG, 2nd. Edition, 1988, Chapter 10.2.4 "Anlagensteuerung", pp. 528–534.

The article "Word Programmer for NMR" by G. Danese, D. Dotti, H. G. Jian, E. Braschi, P. Confrancesco, M. Villa, in Rev. Sci. Instrum., Vol. 57, No. 7, July 1986, pp. 1349–1353 discloses the generation of control signals as individual or discrete bit signals with the assistance of simple commands using a hard-wired logic.

SUMMARY OF THE INVENTION

An object of the present invention is to provide a method for operating a magnetic resonance apparatus which permits new or modified sequences for magnetic resonance experiments to be implemented with minimum difficulty or expense on the part of the apparatus user. Accordingly, it is a further object of the present invention to provide such a method which does not require control word and time duration memories with their corresponding controls.

This object is achieved in a method for operating a magnetic resonance apparatus of the type generally described initially, but wherein every discrete signal value of at least one signal is generated by a virtual machine by processing a virtual machine program.

A "virtual machine" is generally understood as a computer that is simulated with software, i.e. with a computer program. The "virtual machine" thus does not exist by itself, i.e., it cannot be purchased per se. Arithmetic unit, control unit, registers, etc., are thereby simulated in software; they thus do not physically exist, but only exist virtually. Since the instruction set itself is also defined with the virtual computer, a realization tailored to a particular application is possible. The instruction set of the virtual machine is designed such that the problem of controlling a magnetic resonance apparatus with the generation of all appertaining pulses can be programmed therewith in a simple way. The virtual machine thus allows specific, virtual instructions tailored to the operation of magnetic resonance apparatus to be processed. One instruction of the virtual machine is called a "virtual instruction" or "virtual machine instruction". A program composed of "virtual instructions" is referred to as a "virtual program" or "virtual machine program". In a virtual machine, the "virtual instruction" is not interpreted by a hardware circuit as in a traditional computer but instead is interpreted by software. The interpreter programs runs on a traditional computer.

New, additional or modified magnetic resonance sequences can now be easily generated by a modification of the virtual machine program. At the same time, the structure of the hardware is simplified since the control word and time duration memories with the corresponding drive are eliminated. Further, the number and size of the registers in the virtual machine can be matched to the operation of the magnetic resonance apparatus. Overall, a flexibly manipulatable operating method for a magnetic resonance apparatus is thus made available.

In an embodiment, control signals as well as function signals are generated by the virtual machine as time-variable signals, whereby the function signals describe the chronological curve of the excitation pulses and/or of the gradient fields. The operation of the magnetic resonance apparatus can thus be completely controlled by the virtual machine.

In another embodiment, the virtual machine additionally generates acoustic signals by processing the virtual machine program. The acoustic signals can be in the form of instructions or orders to a patient.

In a further embodiment the virtual machine successively forms changing signal values anew and repeatedly outputs unmodified signal values following one another.

In another embodiment signal values of various time-variant signals are emitted as an output in various time grids. The time grids are then optimally matched to the function curve of the signals. For example, the function values for the radio frequency system can be emitted as an output in a fine time grid of 1 µs and the signal values for the gradient system can be emitted as an output in a coarse time grid of 10 µs.

In a further embodiment, the various time grids are generated by different, controllable clock generators, with control data for the clock generators being generated by processing the virtual machine program of the virtual machine. A high degree of flexibility is thus established for producing magnetic resonance sequences. In particular, the discrete signal values of a signal within a sequence can be output in various time grids or clock frequencies. For example, the working frequency of the magnetic resonance apparatus can also be easily modified.

In another embodiment, the control data for the clock generators are intermediately stored in a buffer memory.

In a further embodiment, the signal values of various signals are intermediately stored in the buffer memory. The buffer memories serve for synchronization between signal generation and peripheral operations. The buffer memories are filled during times when calculations are being undertaken at only a low level or not at all are read out during calculation-intensive times. Care must be exercised to ensure that the buffer memories are not empty when a clock generator initiates a read event. The output and offering of the signal values is thus independent of the operating frequency of the processor. In particular, signal values for a number of different signals can thus be simultaneously emitted as outputs.

The number of buffer memories can be modified at any time if, according to another embodiment, the buffer memories are formed in the virtual machine, i.e., the filling of the buffer memories occurs with the virtual machine.

For compensating or for generating differences in transit time between individual signals, the signal values can be written into the buffer memories with different write indicators for the signals and are then read out with a common read indicator in a first version of another embodiment.

In a second, alternative version of this embodiment, the signal values are written into the buffer memories with a common write indicator for the signals and are read out with different read indicators for the signals.

In another embodiment a control module controls the output of the signal values from the buffer memory. The virtual machine is thus relieved from outputting the signal values from the buffer memory.

The control can be realized as a DMA controller for outputting signals in a fine time grid in one embodiment.

The control module can be realized as an interrupt procedure for outputting signals values in a coarse time grid in a further embodiment.

In another embodiment, irrelevant data are stored preceding the signal values in the buffer memory dependent on a chronological relation to the coarse grid. The irrelevant function is composed of data having the amplitude "0" given function values.

Similarly, irrelevant data can be placed following the signal values in the buffer memory dependent on a further, chronological relation to the coarse time grid in a further embodiment.

In another embodiment, interpreters are provided for instructions (magnetic resonance-associated instructions) matched to the functioning of the magnetic resonance apparatus.

DESCRIPTION OF THE PREFERRED EMBODIMENTS

Figure 1:
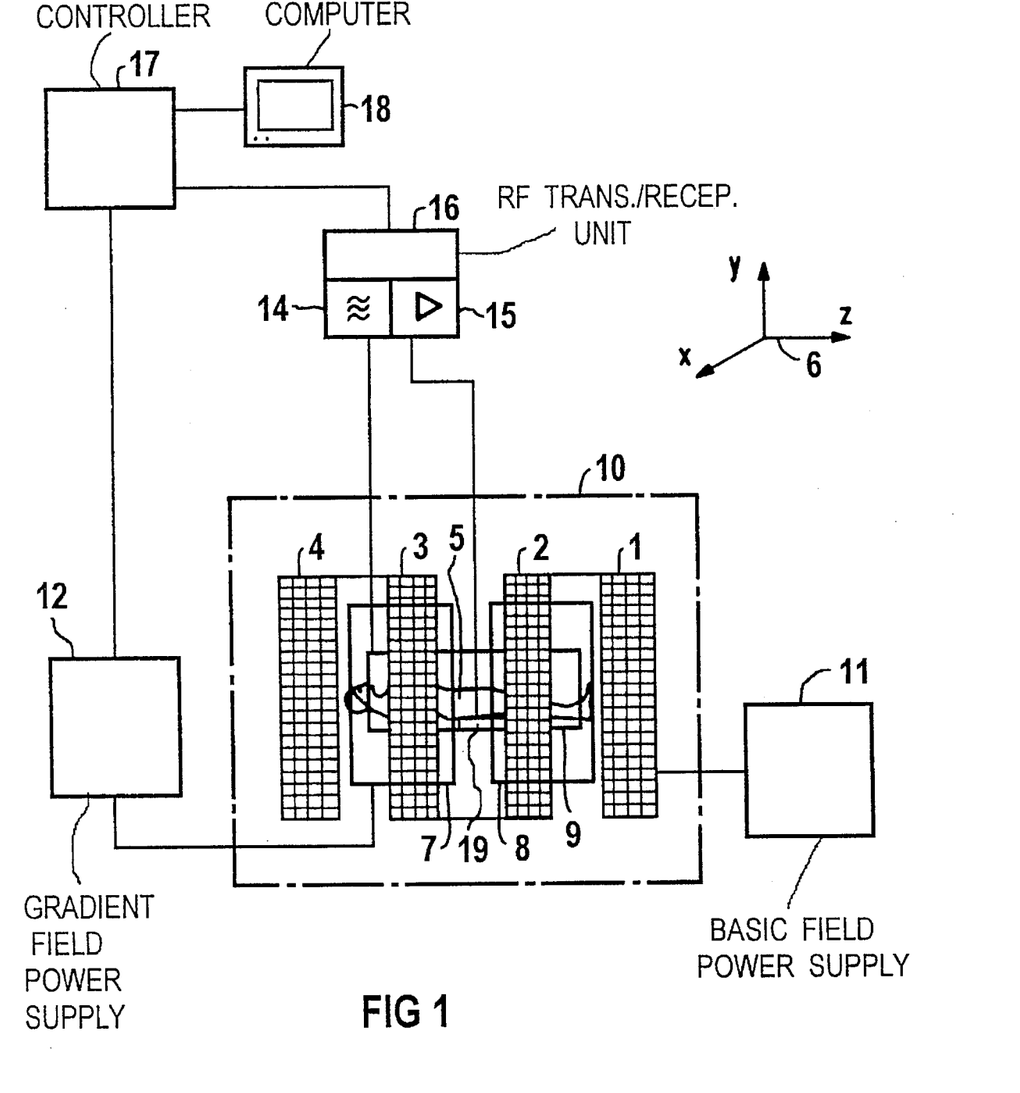
FIG. 1 is a block diagram of a diagnostic magnetic resonance system that can be operated in accordance with the principles of the inventive method.

In the schematic structure of a diagnostic magnetic resonance apparatus for determining images and/or spectra of an examination subject shown in FIG. 1, reference characters 1, 2, 3, 4 indicate coils that generate a basic magnetic field $B_o$ wherein a patient 5 is located during an examination. Gradient coils are also allocated to the basic field $B_o$, these being provided for generating independent magnetic field gradients residing perpendicularly relative to one another in the directions x, y and z according to the Cartesian coordinate system 6. The independent magnetic field gradients are also referred to as selection gradient $G_s$, phase gradient $G_p$ and read gradient $G_r$. By allocating the z-direction to the selection gradient $G_s$, the y-direction to the phase gradient $G_p$ and the x-direction to the read gradient $G_r$, slices parallel to a plane of the coordinate system 6 can be excited and imaged in a known manner with the selection, phase and read gradients $G_s$, $G_p$, $G_r$ and a radio frequency pulse. Arbitrary slices can be excited given an allocation described by a rotational matrix that converts the one vector having the components $G_s$, $G_p$, $G_r$ into a vectors having the components $G_x$, $G_y$, $G_z$. This is also referred to as "multislice-multi-angle".

For clarity, only gradient coils 7 and 8 are shown in FIG. 1. These coils 7 and 8, together with a pair of identical gradient coils lying opposite, serve the purpose of generating a gradient $G_x$ in the x-direction. Identical gradient coils (not referenced) for generating a gradient $G_y$ in the y-direction lie parallel to and above as well as below the patient body 5. The gradient coils for the gradient $G_z$ in z-direction lie transversely relative to the longitudinal axis of the patient 5 at the foot end and at the head end. The arrangement also contains a body resonator 9 functioning as an antenna for the purpose of generating the magnetic resonance signals. A local antenna 19 is additionally provided for picking up the magnetic resonance signals, and this can also serve for the excitation of the magnetic resonance signals alternatively to the body resonator 9. Further local antennas can be provided for special examinations.

The actual examination instrument is composed of the coils 1, 2, 3 and 4 bounded by a dot-dash line 10, the gradient coils (only the gradient coils 7 and 8 are shown as an example), as well as the body resonator 9 and, if used, the local antenna 19. A basic field power supply 11 is provided for the operation of the coils 1–4. The gradient coils 7 and 8 as well as further gradient coils that are not shown are connected to a gradient power supply 12. A radio frequency transmitter 14 controlled by a controller 17 is connected to the body resonator 9. The local antenna 19 is likewise coupled to the controller 17 via a signal amplifier 15 next to the body resonator 9. The controller 17 is also connected to a computer 18 having a picture screen for displaying an output in the form of an image. The computer 18 also has a keyboard for data and instruction input. The components 14 and 15 form a transmission/reception unit 16 for signal generating and signal pick-up. The gradient power supply 12 is also controlled by the controller 17. Hereafter, the transmission/reception unit 16 including the connected antennas 9 and 10 shall be referred to as the radio frequency system. The gradient power supply 12 together with the connected gradient coils form the gradient system. The two systems are activated dependent on time-variant signals that are in the form of discrete signal values and are generated as an output by the controller 17.

Figure 2:
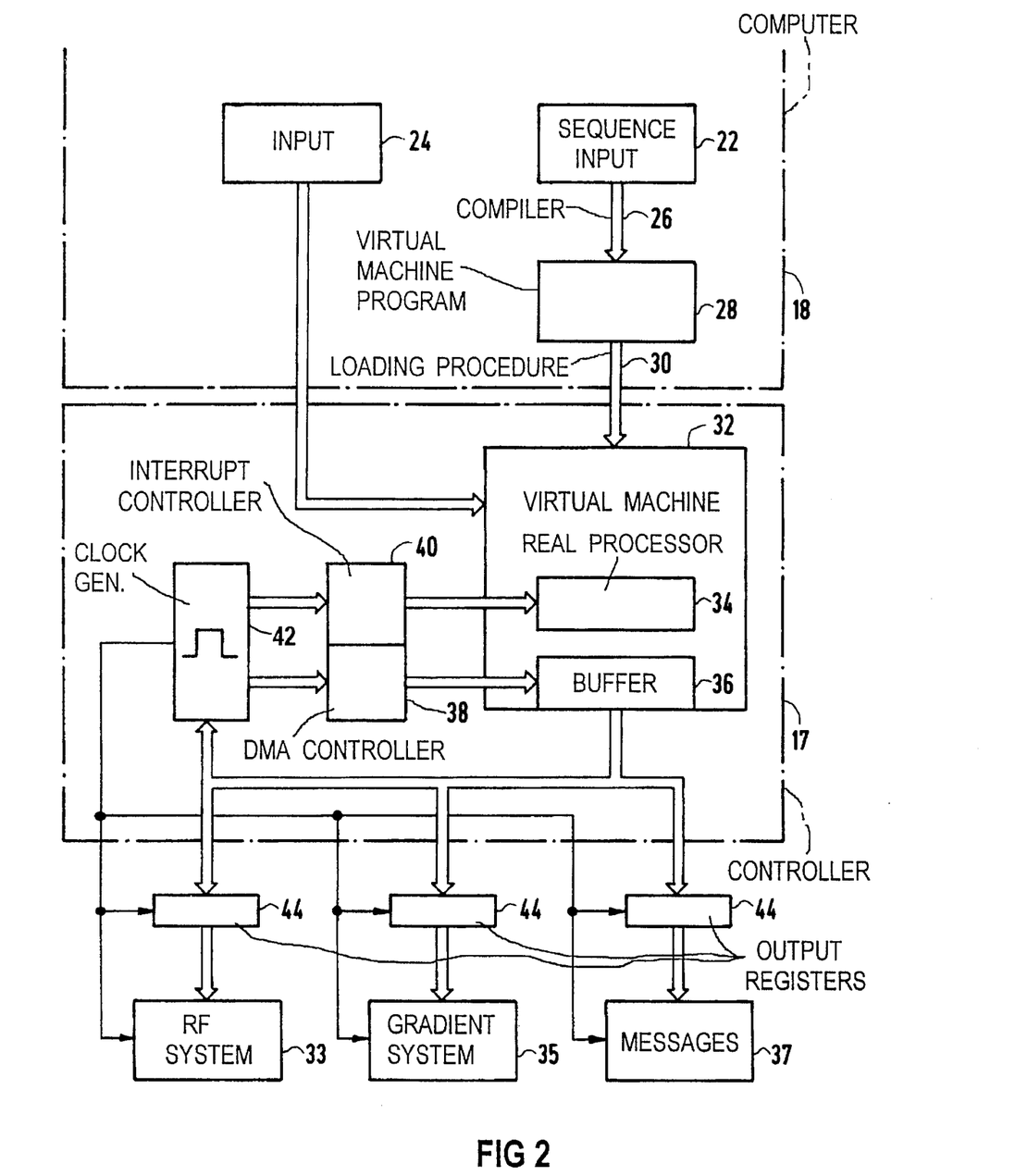
FIG. 2 is a block diagram illustrating control for a magnetic resonance apparatus according to FIG. 1, in the form of a virtual machine in accordance with the principles of the present invention.

FIG. 2 shows the structure of the controller 17 for the operation of the magnetic resonance apparatus. A user level that includes a sequence input 22 and a further input 24 and that belongs to the computer 18 is created for prescribing operation. For example, turn-on or turn-off and trigger signals are entered via the input 24. The sequence for producing a tomogram, for example spin echo pulse sequence, FLASH or FISP sequence or echo-planar imaging sequences are defined and described in the sequence input 22. The graphically or textually described and defined sequence is now converted into a virtual machine program 28 via a compiler 26 likewise belonging to the computer 18, the virtual machine program 28 having a sequence of instructions for a virtual machine 32. The virtual machine program 28 is loaded into the virtual machine 32 with a loading procedure 30. The virtual machine 32 includes a real processor 34 that processes the virtual machine program 28 with the assistance of an interpreter (not shown here) and thereby generates signal values for the radio frequency system 33, the gradient system 35 and for messages 37 for each time grid point and writes them into buffer memories 36. Instructions and orders of a verbal nature for the patient 5 via loudspeakers are also included in the messages 37. The buffer memories 36 are read out via specific control modules, whereby a DMA controller 38 is provided for fine time grids and an interrupt controller 40 is provided for signal values in a coarser time grid.

The time grids for reading out the buffer memories 36 required for the DMA controller 38 and the interrupt controller 40 are generated by controllable clock generators 42. The content of the buffer memories is entered into output registers 44 that are likewise controlled by the clock generators 42. The signal values contained in the output registers 44 are supplied to digital-to-analog converters (not shown here) that are then likewise controlled by the clock generators 42. Here, the digital-to-analog converters belong to the systems 33, 35 and 37.

Figure 3:
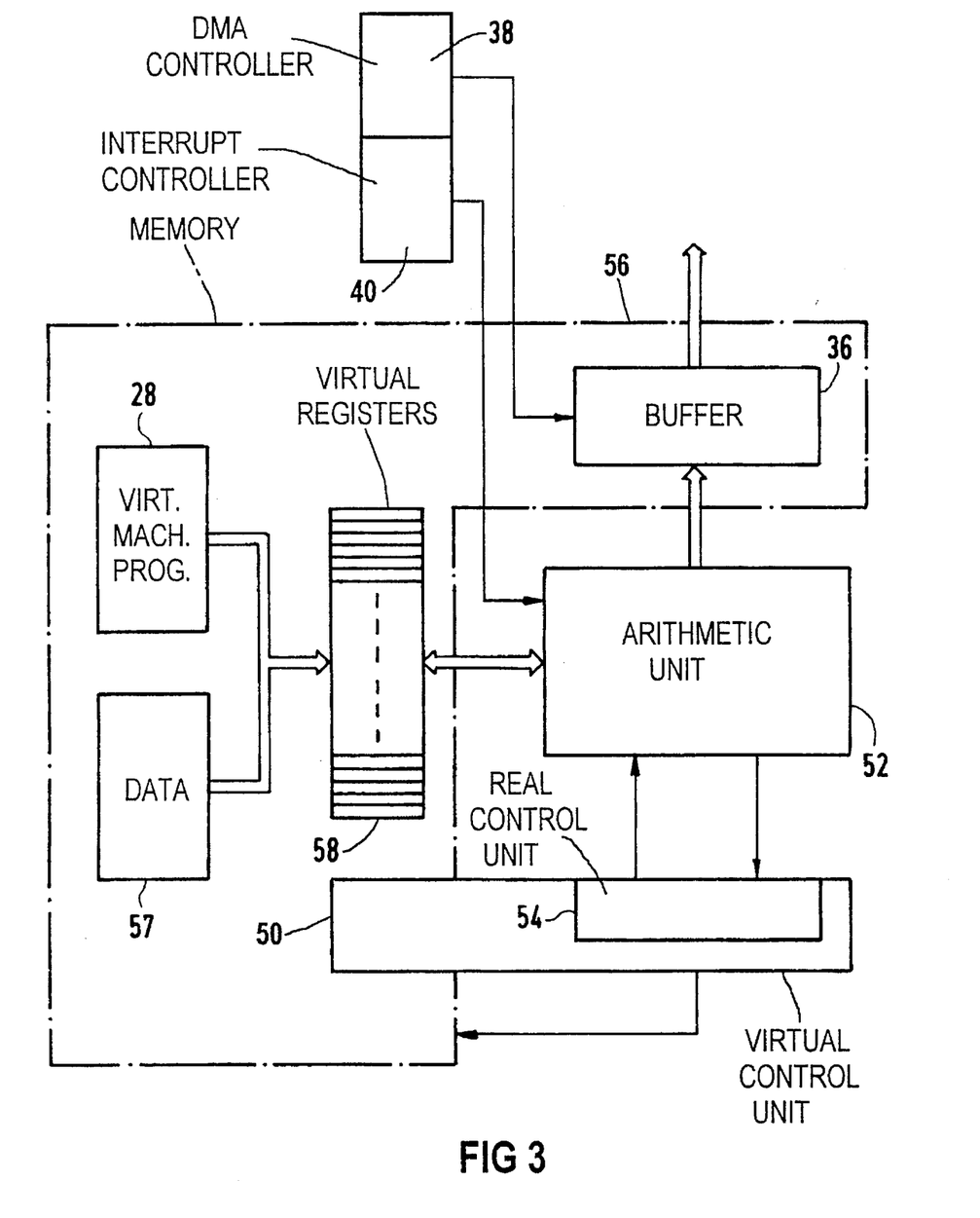
FIG. 3 is a block diagram of a virtual machine in accordance with the principles of the present invention.

FIG. 3 shows the structure of the virtual machine 32. The virtual machine 32 has a virtual control unit 50 to which an arithmetic unit 52 is allocated. The arithmetic unit 52 and a real control unit 54 that belongs to the virtual control unit 50 are realized by a real computer such as, for example, type DSP 96000 of Motorola. A memory 56 is likewise present wherein the virtual machine program 28 and, in an area 57, data are stored in table form. Also belonging to the virtual machine 32 are virtual registers 58 for which areas are likewise reserved in the memory 56. The virtual control unit 50 is realized in software. This software is also deposited in the memory 56. Areas for the aforementioned buffer memories 36 are also defined in the memory 56 and the interrupt routines for reading out the buffer memories 36 are stored.

A total of thirty-two virtual registers 58 for the function values and further control registers are provided for the radio frequency system 33 and the gradient system 35. Simply structured, virtual instructions can thus be construed and be processed in an adequately short time for the operation of the magnetic resonance apparatus. The adequately fast processing of the virtual machine program for offering the signal values for the systems at the right time is particularly enabled by the simultaneous generation of two gradient signal sets each having three gradient signal values of the independent gradients, respectively.

The signal values for the gradient system 35 are determined according to the following principle:

Normed, chronological curves for parts of the signal course of the individual gradients $G_s$, $G_p$ and $G_r$ are stored in gradient tables in the memory area 57. These tabular values, multiplied by corresponding scaling factors, are converted to the required signal values and are combined to form the required signal curve. Since leading and trailing edges must be generated for the gradients, the tables can be read out both forward as well as backward. The gradient values are also multiplied with a rotational matrix in order to register differently oriented planes of section. Additionally, it is possible to superimpose two function curves.

In detail, the following registers are provided for generating the signal values for the gradient system 35:

1. Six gradient table pointer registers wherein six pointers (addresses) are stored in six tables with normed signal values.
2. Six scaling factor registers wherein six scaling factors are stored for denorming the signal values deposited in the gradient tables.
3. A rotational matrix pointer register wherein a pointer for a rotational matrix is stored. The multiplication of three de-normed gradient signal values that belong together by the rotational matrix effects a rotation of the plane of section to be examined.
4. Six logical gradient registers wherein the gradient signal values are stored after the rotation as values $G_x$, $G_y$, $G_z$ for the gradient system 35.

5. Three gradient write indicator registers wherein the write indicators for the buffer memories 36 are stored.

Another ten virtual registers 58 are provided for the radio frequency system 33. First, registers are required for radio frequency parameters that do not change during a radio frequency pulse; second, registers are required for the envelope of the radio frequency signal. These registers are as follows:

1. Frequency register with which the frequency of the radio frequency generator is determined.
2. Phase register with which the phase relation of the radio frequency is defined.
3. Transmission amplification register.
4. Reception amplification register.
5. Pointer register for a characteristics correction array.
6. Amplitude scaling factor.
7. Two pointer registers for a signal value table wherein normed values for amount and phase of the radio frequency envelopes are deposited.
8. Two resisters for signal values of the envelopes.

The control registers store control bits, for example for the activation of analog-to-digital converters in the radio frequency receiver 15, for the turn-off or turn-on of the radio frequency transmitter 14 and for switching detuning switches allocated to the antennas 9 and 19. The number of control registers is dependent on the hardware of the magnetic resonance apparatus.

Figure 4:
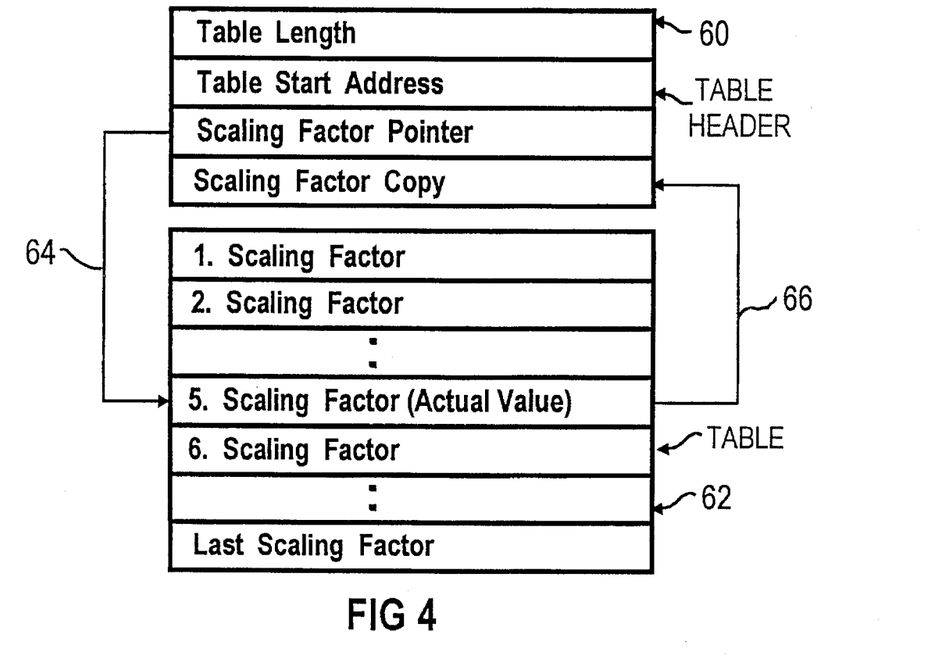
FIG. 4 illustrates a structure of a table header of a stored table in accordance with the principles of the present invention.

FIG. 4 shows a possible structure of a table of scaling factors by which a standardized signal curve is multiplied in order to obtain the desired signal curve. As are the other tables, the table of FIG. 4 is located in the data area 57 of the memory 56. The table has a table header 60 and a table part 62 wherein the individual scaling factors are stored. The table header 60 contains particulars about the table length, a table start address, a pointer 64 or an address for a scaling factor and a copy of this scaling factor (arrow 66). Access to the table is accelerated by the copy of the current scaling factor in the table header 60. In FIG. 4, the pointer addresses a memory area wherein the first scaling factor is stored. After an incrementation of the pointer by the value "one", the sixth scaling factor is copied into the table header.

In general, table header 60 and table part 62 can be deposited in different memory areas of the memory 56. There are, for example, tables for the aforementioned, normed signal curves for gradients, tables for scaling factors, tables for rotational matrices, tables for signal values of envelopes of the radio frequency pulses, tables for the carrier frequency of the radio frequency pulse, tables for the phase relation of the carrier frequency, tables for control bit patterns (for example, ADC on, ADC off), tables for synchronization bits (for example, control bits for antenna detuning) and tables for clock rates or time grids.

Figure 5:
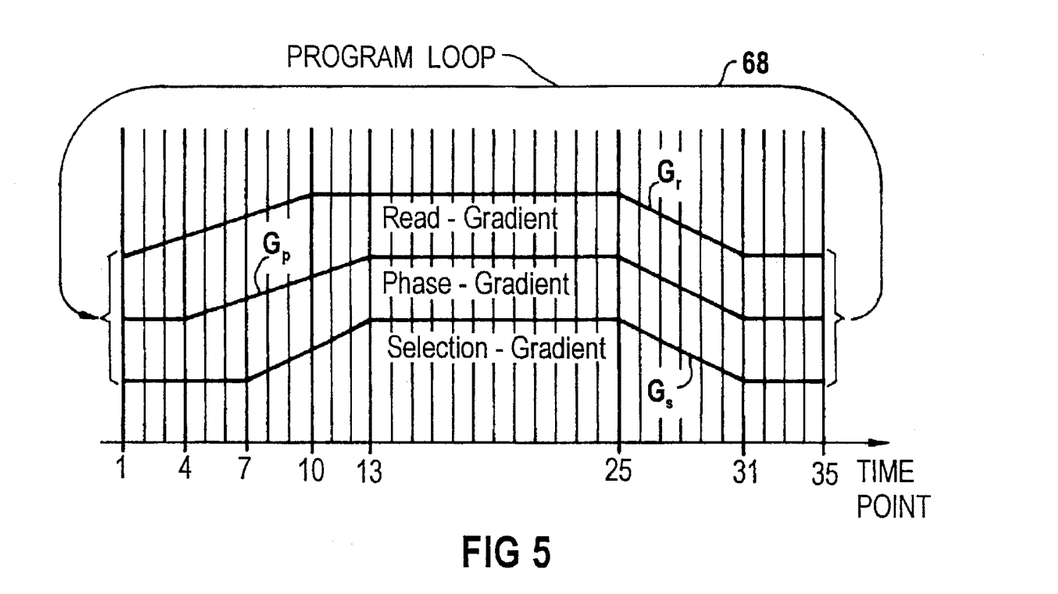
FIG. 5 is a time diagram of the signal values for three exemplary magnetic field gradients used in operating the apparatus of FIG. 1.

The manner by which a signal value for each time grid point is generated by processing the virtual program 28 is then emitted as an and output is set forth in an exemplary manner for gradient signal values with reference to FIG. 5. A region of 35 time grid points is shown with different chronological curves of the individual gradients $G_s$, $G_p$, $G_r$. The gradient shape shown therein should be repeatedly emitted as an output with a program loop 68. At time 1, the program sets the gradient vector composed of $G_s$, $G_p$, $G_r$ to the value "0". Three gradient table pointer registers are then loaded with the start addresses of the tables wherein the required, leading edges of the gradients are stored. Additionally, three scaling factor registers are loaded with scaling factors. A first repetition loop 68 forms the plurality of repetitions over the entire signal curve shown in FIG. 5. The signal values for the read gradient $G_r$ for the times 2–4 are then calculated from the normed gradient table values by multiplication with the corresponding scaling factor. This occurs in a second repetition loop. In this reception loop, additionally, the gradient vector composed of the values 0 for the phase gradient $G_p$ and the selection gradient $G_s$ as well as the calculated value for the read gradient $G_r$ is multiplied by a rotational matrix. Subsequently, the FIFO buffer memory 36 is filled with the rotated vector. The second program loop is thus ended.

In a third program loop, signal values for the phase gradient $G_p$ must be calculated for the times 5–7 in addition to the signal values for the read gradient $G_r$. This gradient vector is also written into the buffer memory 36 after the multiplication by the rotational matrix.

In a fourth program loop, signal values for all three gradients $G_r$, $G_p$, $G_s$ are calculated for the times 8–10, are multiplied by the rotational matrix and are written into the buffer memory 36.

The read gradient $G_r$ is unmodified for times 11–13, whereas the phase and selections gradients $G_p$ and $G_s$ continue to rise in amplitude, this ensuing in a fifth repetition loop. The value which is already present in the corresponding register is employed for the read gradient $G_r$ in order to be rotated subsequently together with the signal values of the two other gradients $G_p$ and $G_s$ and to be written into the buffer memory 36.

The values in the region 14–25 are unmodified and the buffer memory 36 is therefore filled with the last, rotated vector in a sixth loop.

The gradient table pointer registers for the trailing edges must now be set and new scaling factors must be read out. In a seventh loop, the signal values for all three gradients $G_r$, $G_p$, $G_s$ are calculated for the times 26–31, are multiplied by a rotational matrix and are subsequently written into the buffer memory 36. For the last signal loop, finally, the value of the last rotated vector for times 32–35 is again written into the buffer memory 36.

The above program description can be recited as follows with program steps that can be directly converted into instructions for the virtual machine program 28:

gradient vector $(G_s, G_p, G_r)=(0, 0, 0)$
Set three gradient table pointer registers to tables for leading edges
Set three scaling factor registers for lines=1 to repetition factor do
  for j=1 to 4 do
    calculate gradient signal value $G_r$
    multiply gradient vector with rotational matrix
    fill buffer memory with the rotated vector
  end do
  for j=1 to 3 do
    calculate gradient signal value $G_r$
    calculate gradient signal value $G_p$
    multiply gradient vector with rotational matrix
    fill buffer memory with the rotated vector
  end do
  for j=1 to 3 do
    calculate gradient signal value $G_r$
    calculate gradient signal value $G_p$
    calculate gradient signal value $G_s$
    multiply gradient vector with rotational matrix
    fill buffer memory with the rotated vector
  end do
  for j=1 to 3 do
    calculate gradient signal value $G_p$

```
    calculate gradient signal value G_s
    multiply gradient vector with rotational matrix
    fill buffer memory with the rotated vector
  end do
  for j=1 to 12 do
    fill buffer memory with the last vector
  end do
  set 3 gradient table pointer registers to tables for
     trailing edges
  set 3 scaling factor registers
  for j=1 to 6 do
    calculate gradient signal values G_r
    calculate gradient signal value G_p
    calculate gradient signal value G_s
    multiply gradient vector with rotational matrix
    fill buffer memory with the rotated vector
  end do
  for j=1 to 4 do
    fill buffer memory with the last vector
  end do
end do.
```

There are two sub-types for the instruction "calculate gradient signal value" in order to be able to employ the same table for trailing and leading signal edges. This saves memory space. The instruction "calculate gradient signal value" is then divided:

leading edge:

fetch value about gradient table pointer register from table increment gradient table pointer register by "1", multiply fetched value with scaling factor for trailing edge:

fetch value about gradient table pointer register from table decrement gradient table pointer register by "1", multiply fetched value with scaling factor.

Figure 6:
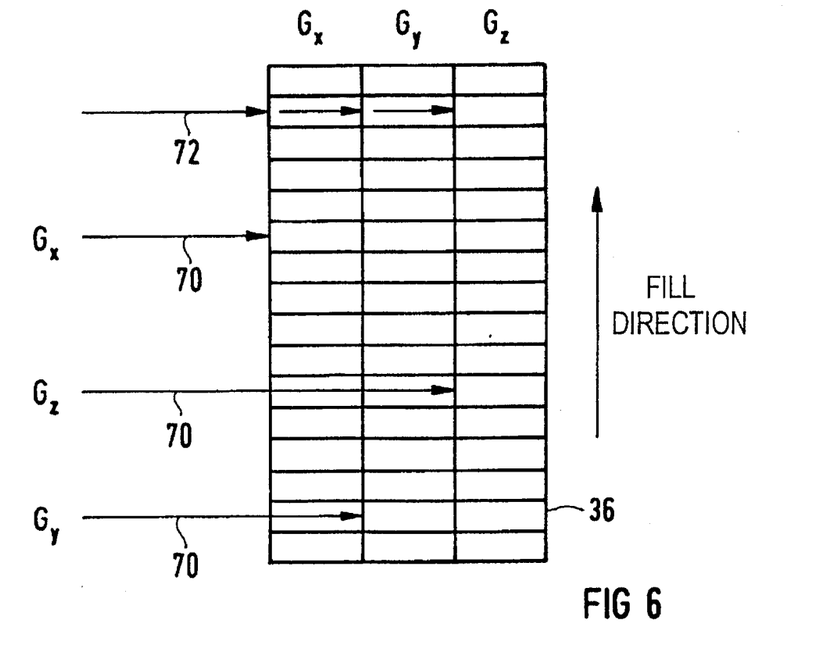
FIG. 6 illustrates the arrangement of a FIFO buffer memory with a plurality of write indicators in accordance with the principles of the present invention.

FIG. 6 shows a portion of the buffer memory 36 wherein the signal values for the three gradients in x, y and z direction are stored and read out. The buffer memory 36 is organized according to the FIFO (first in first out) principle. A write pointer 70 is provided for each gradient for writing the signal value in, as a result of which a line-by-line offset is effected when writing the signal values into the buffer memory 36. The offset is freely selectable by corresponding setting of the write pointer register. Read out is implemented with a read pointer 62 shared by all gradients. As a result of the line-by-line offset of the signal values, the temporal relation of the gradients to one another can be set. Such a temporal fine adjustment is required for example, when the time constants of the gradient coils and/or the time constants of the gradient amplifiers differ.

Figure 7:
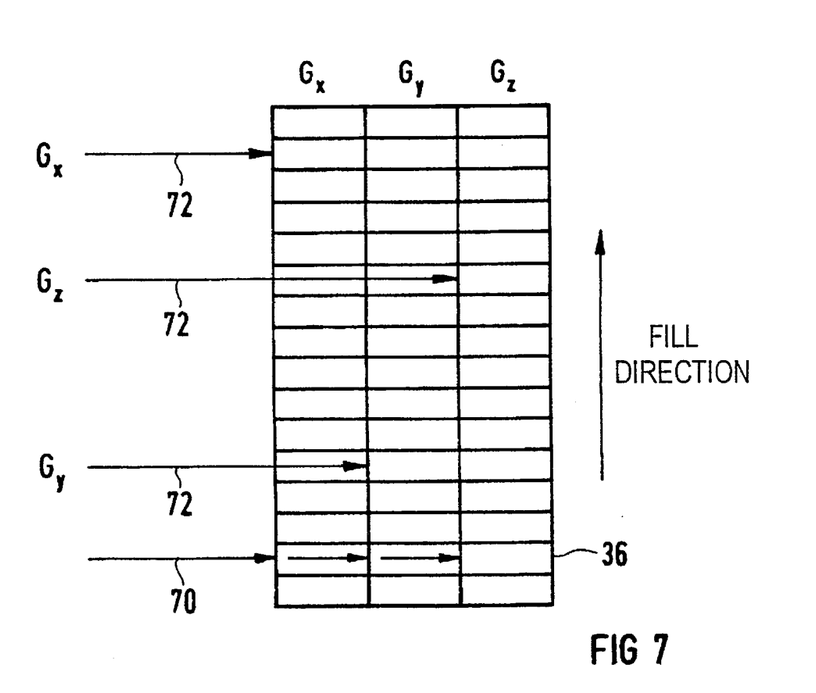
FIG. 7 illustrates the arrangement of a FIFO buffer memory with a plurality of read indicators in accordance with the principles of the present invention.

An alternative solution for assuring a correct temporal relation of the gradient signals relative to one another is shown in FIG. 7. Differing from the embodiment of FIG. 6, however, the signal values for all gradients are read-in in the version of FIG. 7 with a single write pointer 70. The required chronological relation of the signals relative to one another is achieved by read pointers 72 with which the read event can be differently addressed for each gradient.

The virtual control unit 50 (see FIG. 3) includes the control unit of the real machine as well as the interpreter that converts the instructions in the virtual machine program into control signals for the real processor. An area is reserved in the memory 56 for the interpreter. The processing of the virtual machine program begins, after the loading of the virtual machine program, by starting a preparatory program that replaces all instructions or instruction codes (OP codes) of the virtual machine program with the vector addresses in the interpreter. The instruction fetching phase is thus conducted faster. At the end of the preparatory program, an address register of the real machine, that functions as a program counter (PC) for the virtual machine, points to the OP code of the first instruction in the virtual machine program. The last instruction of the preparatory program is a branch into the interpreter of the first instruction in the virtual machine program. Previously, the program counter of the virtual machine is also incremented and then points to the first parameter of the first instruction in the virtual machine program, to the next OP code given instructions without parameters.

In the first instruction word, a virtual machine instruction is composed of the OP code; instruction words following thereupon indicate the parameters of the corresponding instruction. The instructions are modified with the parameters. For example, the registers employed in the instruction, a numerical value for increment or decrement (for generating leading or trailing signal edges), post-decrement or pre-decrement values or post-increment or pre-increment values, a module value or "module value resides in table", a scaling value, a start of table address, an address of a table header start or an address of a table header entry are thus prescribed. The parameters are dependent on the implementation.

The instruction set of the virtual machine required for the operation of the magnetic resonance apparatus includes program steps that allow loops to be formed (nested as well). The number of loop runs can be constant or can differ from loop run to loop run.

Program steps are also present that calculate the signal values of a time-variable function. This can sequence according to three different methods:

1. The required signal values are read from a table and are directly furtherprocessed;
2. The signal values are calculated according to an algorithm; or
3. The signal values of a standardized signal curve are read from tables and are modified with an algorithm, as set forth above with reference to FIG. 5.

There are also instructions that link function values already calculated to one another such as, for example, by multiplying the signal values for the gradient current with a rotational matrix, as a result of which a rotation of the scan slices is achieved.

Further, there are instructions in the virtual machine program that wait for inputs from peripheral units such as, for example, a trigger signal derived from an EKG signal or inputs of a user. The inputs of the peripheral units can be deposited in a buffer memory.

The concept of the virtual machine also offers the possibility of combining instructions that are always processed in the same sequence to form a new instruction and to generate new instructions given modifications of the functionality.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus having a radio-frequency system for transmitting radio-frequency excitation pulses and for receiving magnetic resonance signals from a subject arising from said radio-frequency excitation pulses, and a gradient system for generating chronologically variable, magnetic gradient fields, comprising the steps of:

activating said radio-frequency system and said gradient system dependent on time-variant signals containing discrete signal values; and generating each discrete signal value of at least one of said time-variant signals in a virtual machine by processing a virtual machine program in said virtual machine.

2. A method as claimed in claim 1 wherein the step of activating said radio-frequency system and said gradient system dependent on time-variant signals comprises generating control signals and function signals for activating said radio-frequency system and said gradient system, and generating said function signals to describe a chronological curve for each of said excitation pulses and said gradient fields.

3. A method as claimed in claim 1 comprising the additional step of generating acoustic signals by said virtual machine by processing said virtual machine program.

4. A method as claimed in claim 3 wherein the step of generating acoustic signals comprises generating voice signals.

5. A method as claimed in claim 1 wherein the step of generating each discrete signal value of at least one time-variant signal in said virtual machine by processing said virtual machine program comprises:

identifying a time grid having a plurality of time grid points;

forming internal signal values which change from time grid point-to-time grid point; and emitting output signal values, dependent on said internal signal values, which are unaltered from time grid point-to-time grid point.

6. A method as claimed in claim 1 wherein the step of generating each discrete signal value of at least one time-variant signal in said virtual machine by processing said virtual machine program comprises emitting said discrete signal values as an output in the form of a plurality of time grids.

7. A method as claimed in claim 6 comprising the additional steps of:

generating each time grid by a respective controllable clock generator supplied with control information; and generating the control information for each clock generator in said virtual machine by processing said virtual machine program.

8. A method as claimed in claim 7 comprising the additional step of intermediately storing said control information in a buffer memory.

9. A method as claimed in claim 1 comprising the additional step of intermediately storing each discrete signal value of said at least one signal in a buffer memory.

10. A method as claimed in claim 9 comprising the additional step of forming said buffer memory in said virtual machine.

11. A method as claimed in claim 10 comprising the additional step of organizing said buffer memory in said virtual machine according to the first in, first out principle.

12. A method as claimed in claim 9 comprising the additional steps of:

writing said discrete signal values into said buffer memory with respectively different write pointers; and reading said discrete signal values out of said buffer memory with a common read pointer.

13. A method as claimed in claim 9 comprising the additional steps of:

writing said discrete signal values into said buffer memory with a write pointer shared by all of said discrete signal values; and reading said signal values out of said buffer memory with respectively different read pointers.

14. A method as claimed in claim 9 comprising the additional step of:

controlling output of said discrete signal values from said buffer memory with a control module.

15. A method as claimed in claim 14 comprising the additional step of employing a DMA controller as said control module.

16. A method as claimed in claim 14 comprising the additional step of employing an interrupt controller as said control module.

17. A method as claimed in claim 14 comprising the additional step of storing selected data preceding said discrete signal values in said buffer memory dependent on a temporal relation in a time grid between said selected information and said discrete signal values.

18. A method as claimed in claim 14 comprising the additional step of storing selected data following said discrete signal values in said buffer memory dependent on a temporal relation in a time grid between said selected information and said discrete signal values.

19. A method as claimed in claim 1 wherein the step of activating said radio-frequency system and said gradient system dependent on time-variant signals comprises activating said radio-frequency system and said gradient system dependent on a plurality of function signals, and comprising the additional step of:

operating said virtual machine as an interpreter for an instruction with which at least two different ones of said function signals are superimposed to form a new function signal.

20. A method as claimed in claim 1 wherein the step of activating said radio-frequency system and said gradient system dependent on time-variant signals comprises activating said radio-frequency system and said gradient system dependent on a plurality of function signals, and comprising the additional steps of:

operating said virtual machine as an interpreter for an instruction with which respective signal values of three of said function signals are multiplied with a rotational matrix to obtain a multiplication result; and storing said multiplication result in a buffer memory as a resultant vector.

21. A method as claimed in claim 1 wherein the step of activating said radio-frequency system and said gradient system dependent on time-variant signals comprises activating said radio-frequency system and said gradient system dependent on a plurality of function signals, and comprising the additional steps of:

operating said virtual machine as an interpreter for an instruction with which respective signal values of at least three of said function values are simultaneously stored.

22. A method as claimed in claim 1 wherein the step of activating said radio-frequency system and said gradient system dependent on time-variant signals comprises activating said radio-frequency system and said gradient system dependent on a plurality of function signals, and comprising the additional steps of:

operating said virtual machine as an interpreter for an instruction for loading a register from a table, said table having a table header with an index; and simultaneously updating said index of said table header upon loading of said register.

\* \* \* \* \*